United States Patent [19]

Chan

[11] Patent Number: 5,821,600
[45] Date of Patent: Oct. 13, 1998

[54] ISOLATION BY ACTIVE TRANSISTORS WITH GROUNDED GATES

[75] Inventor: Tsiu Chiu Chan, Carrollton, Tex.

[73] Assignee: STMicroelectronics, Inc., Carrollton, Tex.

[21] Appl. No.: 704,153

[22] Filed: Aug. 28, 1996

Related U.S. Application Data

[63] Continuation of Ser. No. 360,978, Dec. 20, 1994, abandoned.

[51] Int. Cl.$^6$ .............................. H01L 29/00; H01L 29/76
[52] U.S. Cl. ........................... 257/508; 257/499; 257/368
[58] Field of Search ................................... 257/499, 508, 257/509, 408, 488, 401, 368

[56] References Cited

U.S. PATENT DOCUMENTS

| | | | |
|---|---|---|---|
| 4,141,027 | 2/1979 | Baldwin et al. | 357/51 |
| 4,262,298 | 4/1981 | Tuan et al. | 357/41 |
| 4,513,304 | 4/1985 | Takemae | 357/23.6 |
| 4,561,170 | 12/1985 | Doering et al. | 29/571 |
| 4,570,331 | 2/1986 | Eaton, Jr. et al. | 29/576 |
| 4,853,894 | 8/1989 | Yamanaka et al. | 365/154 |
| 4,900,693 | 2/1990 | Manning | 437/79 |
| 4,960,725 | 10/1990 | Noguchi | 437/57 |
| 4,994,893 | 2/1991 | Ozaki et al. | 357/68 |
| 4,996,575 | 2/1991 | Ipri et al. | 357/23.7 |
| 4,998,161 | 3/1991 | Kimura et al. | 357/23.4 |
| 5,043,790 | 8/1991 | Butler | 357/68 |
| 5,067,000 | 11/1991 | Eimori et al. | 357/53 |
| 5,104,822 | 4/1992 | Butler | 437/52 |
| 5,151,759 | 9/1992 | Vinal | 357/23.3 |
| 5,162,890 | 11/1992 | Butler | 257/306 |
| 5,164,803 | 11/1992 | Ozaki et al. | 257/372 |
| 5,164,806 | 11/1992 | Nagatomo et al. | 257/395 |
| 5,221,419 | 6/1993 | Beckett | 156/630 |
| 5,225,704 | 7/1993 | Wakamiya et al. | 257/409 |
| 5,320,975 | 6/1994 | Cederbaum et al. | 437/44 |
| 5,550,397 | 8/1996 | Lifshitz et al. | 257/412 |
| 5,633,524 | 5/1997 | Ueda et al. | 257/369 |

FOREIGN PATENT DOCUMENTS

| | | | |
|---|---|---|---|
| 0 150 993 A3 | 8/1985 | European Pat. Off. | 257/508 |
| 0 321 738 A3 | 6/1989 | European Pat. Off. | 257/508 |
| 0 361 121 A3 | 4/1990 | European Pat. Off. | 257/508 |

OTHER PUBLICATIONS

"Selective removal of polysilicon to obtain improved masterslice," *IBM Technical Disclosure Bulletin* 31(4); 249–252, 1988.

Abbas, S.A., et al., "Low–leakage, N–channel silicon gate FET with a self–aligned field shield," *IEDM Technical Digest*, IBM System Products Div., N.Y., 1973, pp. 371–373.

Terman, L.M., "Aluminum–silicon self–aligned gate process with field shield," *IBM Technical Disclosure Bulletin* 15(9): 2852–2854, Feb. 1973.

Krick, P.J., "Triple density MNOS memory array with field shield," *IBM Technical Disclosure Bulletin* 16(6): 1723–1725, Nov. 1973.

Kalter, H.L.; Vanderslice, W.B., Jr., "Making a one–device memory cell," *IBM Technical Disclosure Bulletin* 18(4): 1019–1020, Sep. 1975.

(List continued on next page.)

Primary Examiner—Steven H. Loke
Attorney, Agent, or Firm—David V. Carlson; Theodore E. Galanthay; Lisa K. Jorgenson

[57] ABSTRACT

An isolation gate structure is formed between active areas on a P-type semiconductor substrate. The isolation structure includes a thick gate oxide layer over which is formed a P-doped polycrystalline silicon layer. The polycrystalline silicon layer is electrically connected to the substrate, by buried contact if desired, and can further be electrically connected to a source region formed within the active area. The polycrystalline silicon layer and substrate are connected to ground potential, thus preventing current flow between active areas.

18 Claims, 4 Drawing Sheets

OTHER PUBLICATIONS

Koyanagi, M.; Sunami, H.; Hashimoto, N.; Ashikawa, M. "Novel high density, stacked capacitor MOS RAM," *IEDM Technical Digest*, IBM System Products Div., N.Y., 1978, pp. 348–351.

Erb, D.M.; McCombs, A.; Radwin, M. "Hi–C isolation of DRAM storage capacitors," *IEDM Technical Digest*, IBM System Products Div., N.Y., 1982, pp. 612–615.

Shimizu, M.; Inuishi, M.; Ogawa, T.; Miyatake, H.; Tsukamoto, K.; Akasaka, Y. "Deep submicron device isolation with buried insulator between source/drain polysilicon . . . ," *IEDM Technical Digest*, IBM System Products Div., N.Y., 1988, pp. 96–99.

Wakamiya, W.; Timori, T.; Ozaki, H.; Itoh, H.; Fujiwara, K.; Shibano, T.; et al. "Fully planarized 0.5 $\mu$m technologies for 16M DRAM," *IEDM Technical Digest*, IBM System Products Div., N.Y., 1988, pp. 246–249.

Manchanda, L.; Hellenius, S.J.; Lynch, W.T.; Cong, H.–i.; Ng, K.K.; et al. "A high–performance directly insertable self–aligned ultra–rad–hard and enhanced isolation field–oxide technology . . . ," *IEEE Transactions on Electron Devices* 36(4): 651–658, 1989.

Iwamatsu, T.; Yamaguchi, Y,; Inoue, Y.; Nishimura, T.; Tsubouchi, N. "CAD–compatible high–speed CMOS/SI-MOX technology using field–shield isolation . . . ," *IEDM Technical Digest*, IBM System Products Div., N.Y., 1993, pp. 475–478, 1993.

ISOLATION BY ACTIVE TRANSISTORS WITH GROUNDED GATES

CROSS-REFERENCE TO RELATED APPLICATION

This application is a continuation of U.S. Pat. application No. 08/360,978, filed Dec. 20, 1994, now abandoned.

TECHNICAL FIELD

This invention relates generally to integrated electronic circuits, and more particularly to isolation of active regions in MOS integrated circuits.

BACKGROUND OF THE INVENTION

In today's metal-oxide semiconductor (MOS) integrated circuit design, active regions on a chip are isolated from each other by a thick layer of thermally grown oxide, known as a field oxide, overlying doped channel-stop regions. This method of isolation has a number of disadvantages that become increasingly apparent with higher component density on the chip. The field oxide grows in areas not covered by a nitride mask layer used to define the active regions during processing. The use of a nitride mask forms a characteristic "bird's beak" shape in the oxide that consumes what would otherwise be usable active area while insignificantly contributing to the isolation function of the field oxide. The channel-stop dopants may also diffuse into the active area upon thermal growth of the field oxide, causing a narrow channel effect and increasing required threshold voltages for components constructed in the active regions. Further, mobile ions arising from electrical stress can cause shifts in the field threshold voltage, resulting in inconsistent performance of active circuit components.

In an isolation structure known as the "sea-of-gates," every other one of transistors has a grounded gate, thereby isolating those transistors without grounded gates on each of two opposite sides, while the traditional field oxide and channel stops are used to complete the isolation. However, all of the transistors in "sea-of-gate" design are of identical construction, and those with grounded gates are not therefore expressly designed or tailored for the isolation function they serve.

With increasing component density in today's integrated circuit design, it is highly desirable to provide effective isolation of active regions on a chip while minimizing the consumption of otherwise usable active area unnecessary to the isolation function.

SUMMARY OF THE INVENTION

According to the present invention, an isolation gate structure is constructed between or around active areas of a semiconductor substrate by forming an insulating layer on the surface of the substrate, forming a polycrystalline silicon layer on the insulating layer, and selectively etching away portions of the deposited layers to expose the active areas of the semiconductor substrate for further processing. The polycrystalline silicon layer is preferably of the same conductivity type as the substrate and is regularly connected to the substrate at buried contacts, thereby ensuring that the polycrystalline silicon layer and substrate remain at the same electric potential. The polycrystalline silicon layer is connected to a constant value electric potential supply selected to prevent current flow between active areas. Further, the polycrystalline silicon layer can be connected to a source or drain region of the active area, as appropriate, with metal or metal silicide local interconnects.

DETAILED DESCRIPTION OF THE PREFERRED EMBODIMENT

Figure 1:
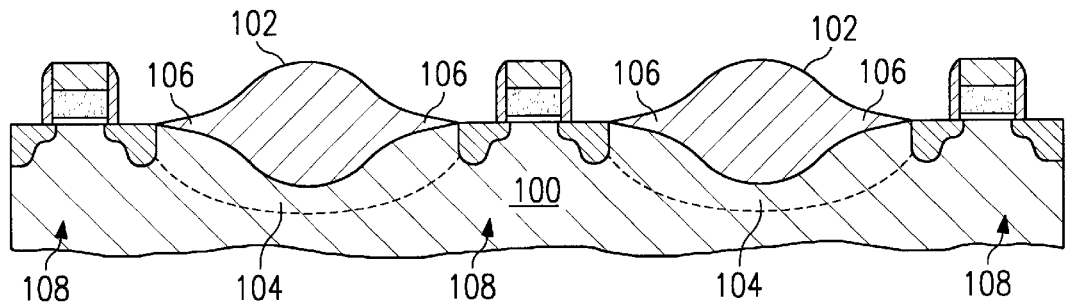
FIG. 1 is a cross-sectional view showing the prior art isolation of active areas by a thick layer of field oxide exhibiting the characteristic bird's beak.

FIG. 1 shows the NMOS prior art isolation of active areas 108 in a P-type substrate 100 by a thick layer of thermally grown field oxide 102. Below the field oxide 102 are channel-stop regions 104 formed by P-type implants which diffuse into the substrate 100 upon the thermal growth of the field oxide. The shape of the field oxide 102 exhibits the characteristic bird's beak feature 106 that arises from the field oxide penetrating beneath a silicon nitride layer used to define the active areas 108 on the chip during field oxide growth. One drawback of the current art method of forming the field oxide 102 is that if the active area 108 dimensions are too small, bird's beak encroachment can lift up and separate the silicon nitride layer from the underlying silicon, resulting in an even longer bird's beak structure or possible loss of all active area.

Figure 9:
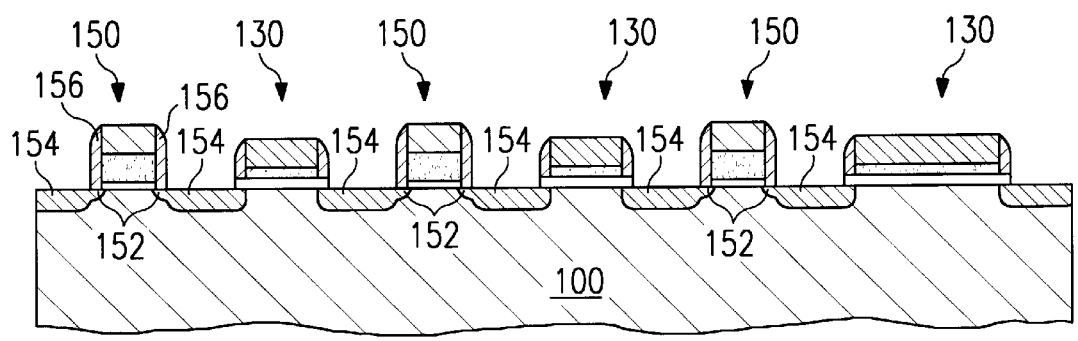
FIG. 9 shows the layers of FIG. 8 with the addition of oxide side spacers and implanted drain and source regions.

The bird's beak 106 is unnecessary to the isolating function of the field oxide 102 and disadvantageously consumes what would otherwise be active area of the substrate 100 usable for circuit component construction. In current art integrated circuit construction, each bird's beak 106 can extend, in some designs, in excess of 2500 angstroms into what would otherwise be usable active area. Additionally, the doped channel-stop regions 104 diffuse into the active areas and in some designs may cause a narrow channel effect, raising the threshold voltage of transistors constructed in the active areas. The bird's beak feature 106 of the field oxide 102, as well as the narrow channel effect produced by the channel-stop region 104, limits both the minimum dimensions separating active areas 108 and the minimum size of those active areas, thus causing difficulties in increasing the integration density. As seen in FIG. 9, and as discussed in detail below, practice of the present invention accomplishes the desired isolation with a minimum spacing between active areas of the substrate 100.

Figure 2:
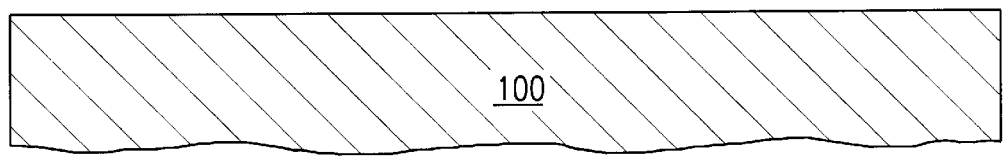
FIG. 2 shows a cross-sectional view of a portion of P-type substrate upon which an integrated circuit structure according to the present invention is to be formed.

FIGS. 2–9 illustrate the main steps carried out in practicing the present invention and the structure of the present invention. FIG. 2 shows a semiconductor substrate 100 which, in accordance with the present invention, is preferably doped either N-type or P-type. The substrate 100 could be substrate itself or, alternatively, an N-well or P-well used in connection with a CMOS process, a doped epitaxial layer, or other substrate structure. In one embodiment, the substrate 100 is doped with Boron in approximate concentration of $10^{16}$–$10^{17}$/cm$^3$. Additional processing steps such as threshold adjustment implants, epitaxial growth, well formation and the like may be carried out as desired for each design. While the main steps according to the present invention are shown and described herein, every single step in the entire process need not be shown because such are part of the standard processing steps commonly used and known in the art.

Figure 3:
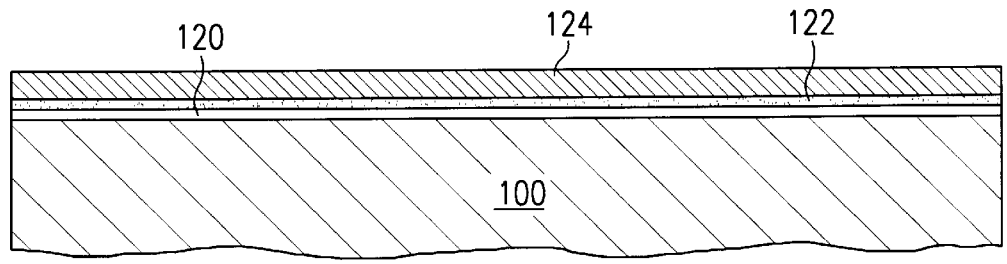
FIG. 3 is a view of layers grown and deposited according to the present invention on the surface of the substrate of FIG. 2.

Referring to FIG. 3, a first gate insulator layer or oxide 120 is grown over the entire substrate 100, followed by a deposited first polycrystalline silicon layer 122 and a deposited covering oxide layer 124. In the preferred embodiment, the first gate oxide layer 120 is somewhat thicker than a gate oxide layer used for an active transistor on the same chip. For example, the first gate oxide layer 120 may be approximately 500 angstroms thick if the standard gate oxide layer thickness is in the range of 90–200 angstroms. This ensures a slightly higher threshold voltage for the isolation gate structure 130 to be formed (see FIG. 4). In the preferred embodiment, the polysilicon layer 122 is in the range of 500 angstroms thick, but could be somewhat more or less as desired. The deposited oxide layer 124 is approximately 2000 angstroms thick. In the embodiment with a P-type substrate 100, the first polycrystalline layer is preferably doped with a P-type impurity such as Boron and in concentration roughly two to five times that of the substrate. The doping concentration of the first polysilicon layer 122 is selected to provide adequate conductivity but not be so high that Boron atoms migrate into the substrate 100 in sufficient quantity to affect the conductivity of the substrate. The slightly thicker oxide 120 also helps prevent this migration.

In the preferred embodiment, the polysilicon 122 is doped with the same conductivity type as the substrate. This provides the advantage that direct ohmic contact via a buried contact to the substrate is possible. This also reduces the risk of problems if there is a pin-hole in the oxide with some slight migration of ions. Thus, on an N-type substrate, the first polysilicon layer is doped N-type. The oxide layer may be made thinner or thicker, depending on the dopant ions used and the concentrations thereof, since some ions have a lesser tendency to migrate than others.

Figure 4:
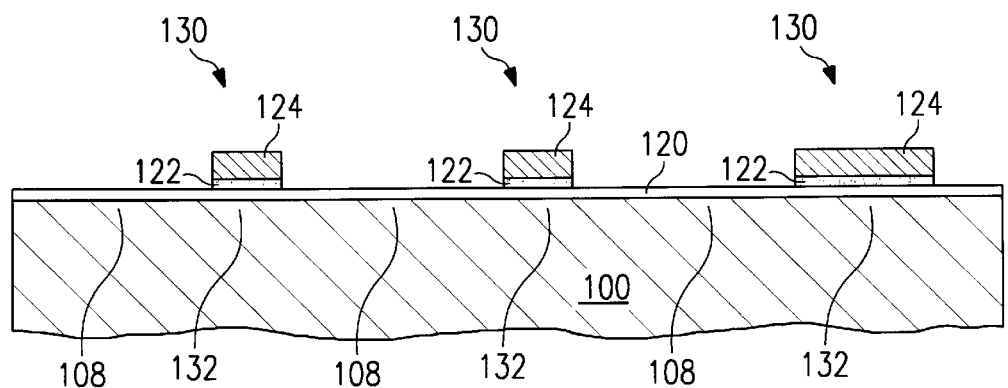
FIG. 4 shows a selective etching of the layers of FIG. 3.
Figure 5:
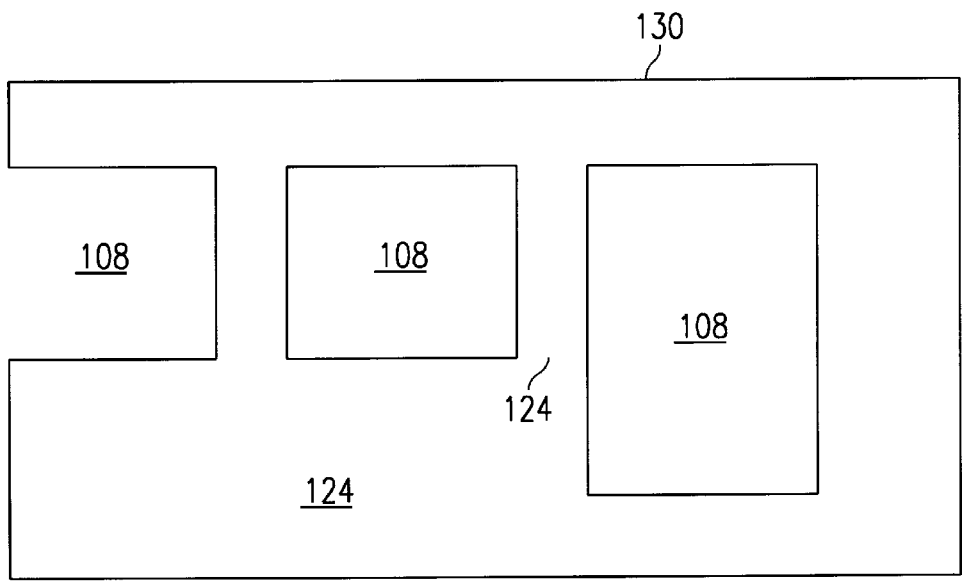
FIG. 5 is a top view of the selectively etched layers of FIG. 4, showing one possible embodiment of a circuit structure.
Figure 6:
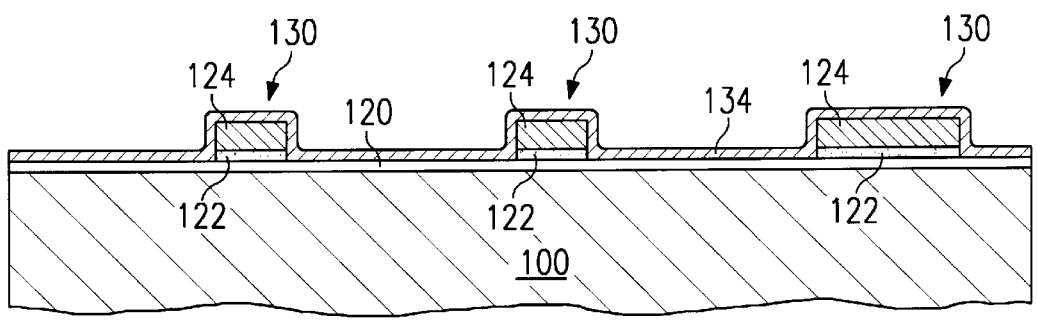
FIG. 6 shows an oxide layer deposited on top of the selectively etched layers of FIG. 4.

Referring to FIGS. 4 and 5, the surface of the chip is patterned and etched to form an isolation gate structure 130. As best seen in FIG. 5, one possible circuit configuration has the isolation gate structure 130 and the underlying isolation area 132, shown in FIG. 4, surrounding each of active regions 108 in which transistor structures will be formed by subsequent processing steps. The isolation layer may include openings, and the polycrystalline silicon layer fills the openings to make a buried direct contact with the semiconductor substrate. In one embodiment, an isolation structure for an integrated circuit according to the invention includes a semiconductor substrate having an active area and an isolation area surrounding the active area. An insulation layer overlies the isolation area and surrounds the active area. In addition, a polycrystalline silicon layer overlies the insulation layer and surrounds the active area. An electric potential supply is provided, and an electrical connection is made between the polycrystalline silicon layer and the electric potential supply. The value of the electric potential supply is selected to ensure that the isolation area underlying the insulation layer is prevented from conducting electric currents therein. In the case of a P-type substrate 100, the first polycrystalline silicon layer 122 is preferably electrically connected to the lowest voltage supplied to the chip, typically ground potential, to ensure that the region 132 under the isolation gate 130 never conducts, thereby electrically isolating regions 108 from one another. In one embodiment, the semiconductor substrate is of P-type and the selected electric potential is the lowest electric potential supplied to the integrated circuit. In another embodiment, the semiconductor substrate is of N-type and the selected electric potential is the highest electric potential supplied to the integrated circuit. Most often, the substrate 100 will also be connected to this lowest voltage, and in such structures it is advantageous to provide regular and direct contact between the first polycrystalline layer 122 and the substrate, by metallization layers and/or buried contacts, not shown because such are well known in the art, and any suitable ohmic layer contact to the substrate is acceptable.

The comparable doping of the substrate 100 and the first polycrystalline silicon layer 122 provides for an ohmic connection at the buried contacts, and renders harmless any diffusion effects arising from pin-hole defects in the oxide layer 120. A further advantage is that the grounded isolation gate structure 130 will shield against any field threshold shifts arising from mobile ions. It will be appreciated that the greatest advantage of the present invention is achieving the function of isolation with minimal dimension requirements. The isolation structure 130 of the present invention requires only the current art minimum dimensions for forming a gate structure as opposed to the in excess of three times larger minimum dimensions required for current art isolation field oxide growth.

The first gate oxide layer 120 is preferably somewhat thicker than an oxide layer for an operating transistor of the same circuit, resulting in a relatively higher magnitude threshold voltage to turn on the "channel" region 132 under the isolation gate 130. Indeed, turning on the "channel" region 132 is neither anticipated nor desired. In the case of a P-type substrate 100, the grounding of the first polycrystalline silicon layer 122 to the lowest voltage on the chip and the thick gate oxide 120 are design features tailoring the gate 130 for isolation purposes and keeping this "channel" region 132 turned off to perform the isolation. The same conductivity type doping permits easy grounding of the polysilicon 122 to the substrate 100 if desired. Of course, the isolation method and structure of the invention are applicable to a thin gate oxide 120 if design permits, the object being to prevent deleterious migration of dopant between the poly layer 122 and the substrate 100 and to keep the "channel" 132 off at all times.

Figure 7:
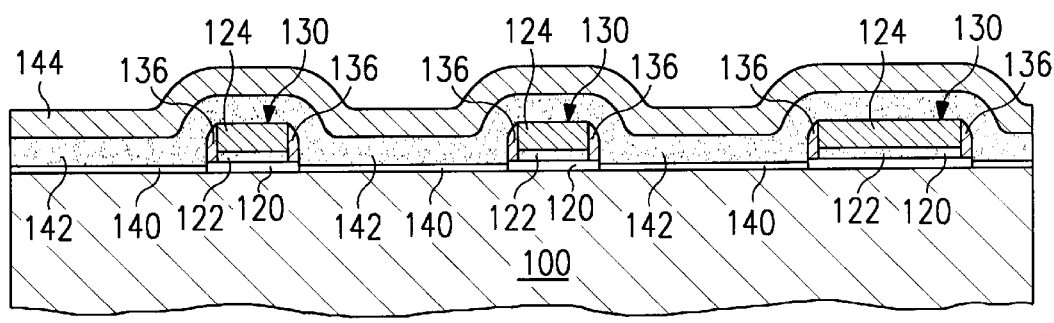
FIG. 7 shows a selective etching of the layers of FIG. 6 and subsequently grown and deposited layers.

In the next process step, an oxide (LTO) layer 134 is formed over the entire chip (see FIG. 6) by any acceptable technique, by growth or preferably using a chemical vapor deposition (CVD) process. Referring to FIG. 7, the oxide layer 134 is then etched using an anisotropic plasma etch, resulting in sidewall spacers 136 alongside the isolation gate structure 130. Both the sidewall spacers 136 and the covering oxide layer 124 guard against the short circuiting of the isolation gate structure 130 with other constructed circuit components. The covering oxide layer 124 also guards against contamination of the doped first polycrystalline silicon layer 122 by subsequent ion implantation procedures.

The exposed portion of the first gate oxide layer 120 is removed and a second gate oxide 140, with preferable thickness in the range of approximately 90–120 angstroms, is grown in its place. A second polycrystalline silicon layer 142, of approximately 1500 angstroms thickness, is then deposited over the surface of the chip, and subsequently a titanium silicide or other metal silicide layer 144, also of approximately 1500 angstroms thickness, is deposited. In the case of a P-type substrate 100, the covering oxide layer 124 prevents the Boron dopant in the first polycrystalline silicon layer 122 from migrating into the second polycrystalline silicon layer 142 which is itself negatively doped for lower resistivity.

Figure 8:
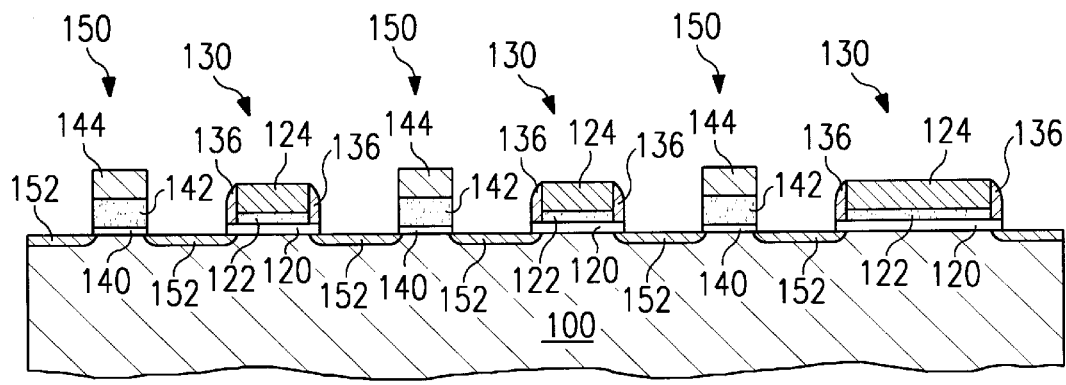
FIG. 8 shows a selective etching of the layers of FIG. 7 and a subsequent N-type implant preparatory to configuration of lightly doped drain and source structures.

Referring to FIG. 8, the surface of the chip is patterned and etched to form gate structures 150. Implants are made to form lightly doped drain (LDD) and source extensions 152. After LDD implant and anneal, and as seen in FIG. 9, sidewall spacers 156 are formed on the gate structures 150 by anisotropic etch of a CVD oxide layer. Heavily doped drain and source regions 154 are then formed by ion implantation and anneal as is well known in the art. Subsequent processing and finishing steps are well known to the art, such as further CVD layers with contact holes for metallization overlays and a finishing overglass layer, and are neither further described nor depicted in the figures.

Figure 11:
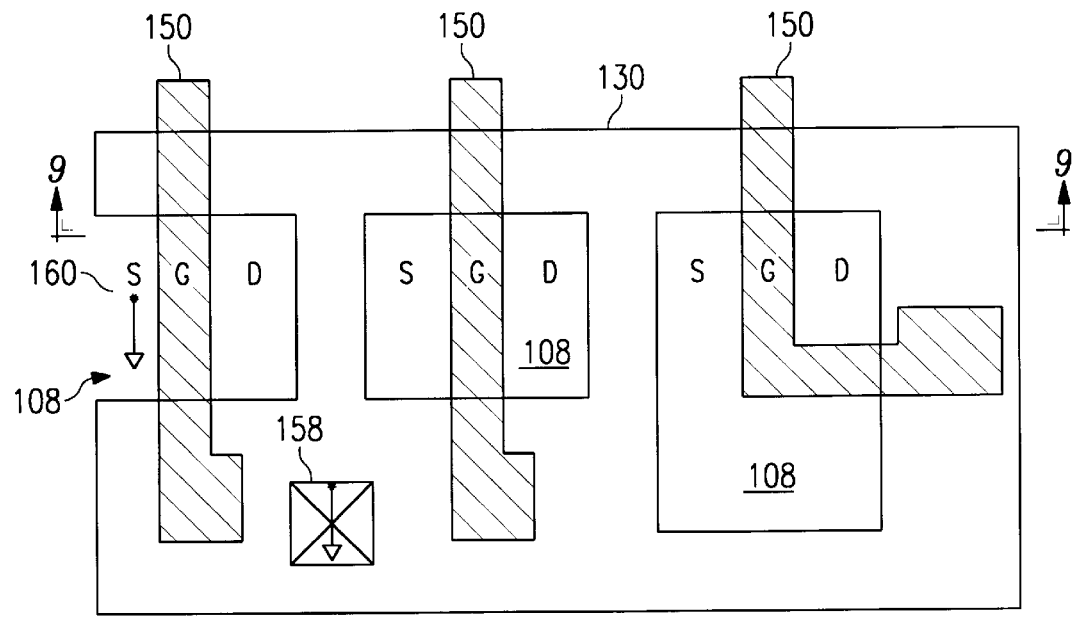
FIG. 11 is a top view of FIG. 9, showing one possible embodiment of a circuit structure, and showing electrical connections to ground potential schematically.

FIG. 11 is a top view of FIG. 9, showing one possible embodiment of a circuit structure incorporating the present invention, and indicates the gate, source and drain portions of the active regions 108 surrounded and separated by the isolation gate structure 130. A connection of the isolation gate 130 to ground, by buried contact to the P-type substrate 100, is shown schematically at 158. Buried contacts between the first poly layer 122 and the substrate 100 are formed at regular intervals and with proper spacing to ensure good ohmic electrical contact between the first polysilicon and the substrate, and to ensure the equipotential nature of the first poly and substrate. Of course, this type of structure is repeated throughout the chip and only a portion of the chip is shown. Active areas 108 will be formed above and below those shown in FIG. 11, and all the active areas are isolated by the gate isolation structure 130 in those places where field oxide was previously used.

Figure 12:
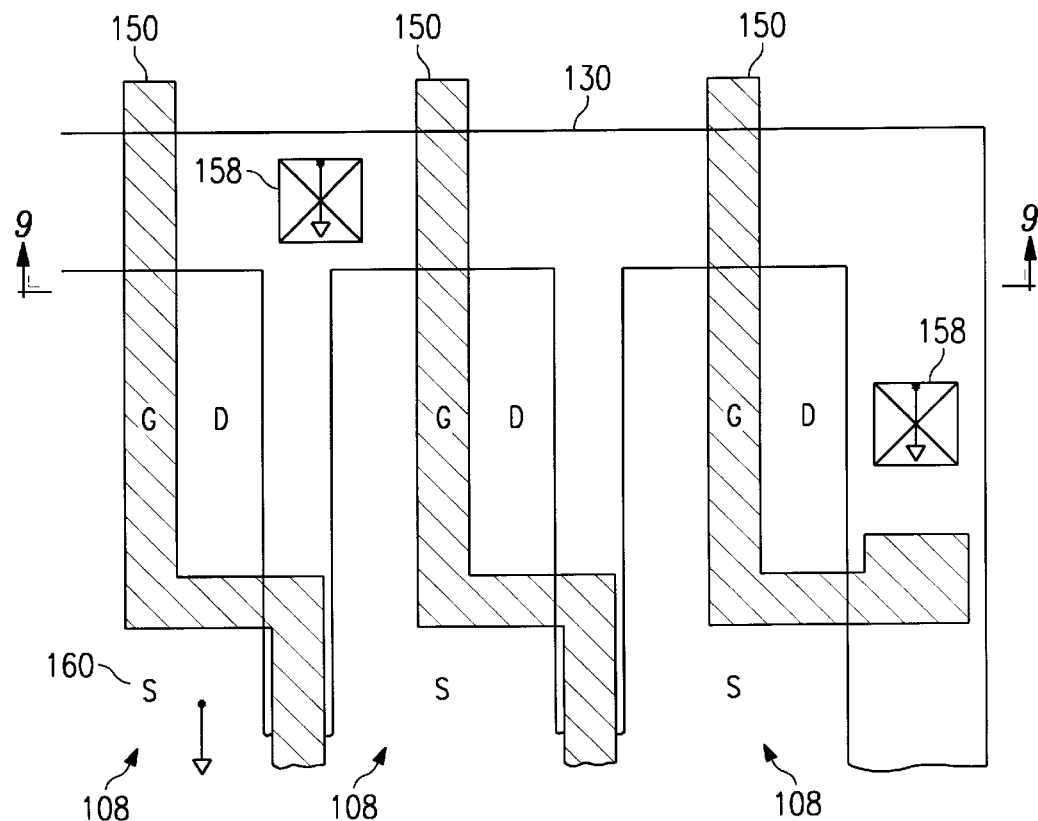
FIG. 12 is a top view showing a second possible embodiment of a circuit structure.

FIG. 12 is a top view showing a second possible embodiment of a circuit configuration where the isolation gate structure 130 is formed between, but does not surround, active areas 108. Indeed, as is common in the art, two such adjacent active areas 108 may be contiguous at, for example, a common source region (not shown). The isolation gate structure 130 isolates these active areas 108, just as current art field oxide does in such circuit designs, but advantageously allows the active regions 108 to be spaced more closely.

Figure 10:
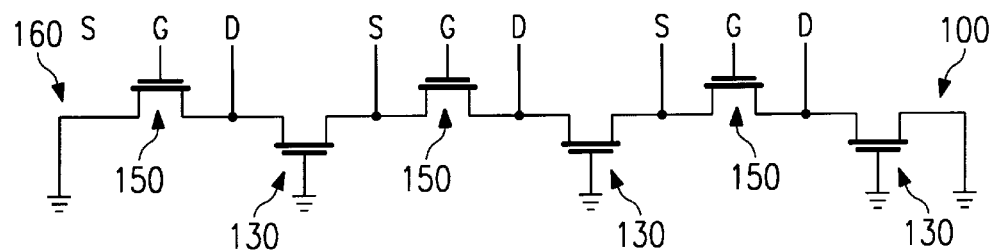
FIG. 10 is an electrical schematic diagram of the structure of FIG. 9, showing electrical connections to ground potential.

FIG. 10 is a schematic diagram of the structure of FIG. 9, showing electrical connections to ground potential of a source 160, the substrate 100 and the isolation gate structure 130. Many circuits have the source and substrate connected to the same low voltage potential, usually ground. Both the substrate 100 and isolation gate structure 130 are tied to the same voltage potential as the grounded source 160. Should it be desirable, the grounded source 160 can also be electrically connected to the substrate 100 via metal or metal silicide local interconnects as is common in the art. Further, the isolation gate structure 130 can be electrically connected to the grounded source 160 by metal or metal silicide local interconnects as desired. If a contact is made between the isolation gate 130 and the source 160, a metal contact of some type is preferred to ensure a PN junction is not formed because the source 160 and the poly of the isolation structure 130 would usually be of opposite conductivity types.

It will be appreciated that, while an illustrative embodiment of the invention has been described for purposes of illustration, modifications may be made without departing from the spirit and scope of the invention. For example, the order of process operations could be changed so as to construct the isolation gate structure from the second poly layer after the circuit component gates have been formed. The specific details for the construction of an isolation gate structure over a P-type substrate for isolating N-channel field-effect enhancement mode transistors has been described above. However, it will be appreciated by those skilled in the art that the present invention can be applied to a wide range of MOS integrated circuit structures to replace the field oxide isolation structure. As one example, a reversal of conductivity types allows a similar isolation gate structure to be formed in an N-type substrate. In this embodiment, the polysilicon 122 is doped N-type and is tied to the highest voltage potential on the chip, usually the N well, to ensure that the region of the substrate underlying the isolation gate structure never conducts and always isolates the active areas in the N-type substrate from each other.

The invention may also be used on the same chip in combination with field oxide isolation. For example, the isolation gate structure may be used within a memory array where space is precious, and standard field oxide isolation can be used in the peripheral circuits, as desired.

While various embodiments have been described in this application for illustrative purposes, the claims are not limited to these embodiments. Many modifications can be made to the structures and methods shown and described herein that take advantage of the present invention. For example, some method steps can be added or substituted for the steps disclosed and claimed herein to achieve this invention.

I claim:

1. An integrated circuit, comprising:
   a semiconductor substrate having an active area and an isolation region surrounding the active area;
   an insulation layer overlying the isolation region and having a plurality of spaced contact openings to the isolation region; and
   a polycrystalline silicon layer of a same conductivity type as the isolation region and having a doping concentration approximately two to five times a doping concentration of the isolation region, the polycrystalline silicon layer overlying the insulation layer and filling each of the contact openings in the insulation layer and contacting the isolation region of the semiconductor substrate.

2. The integrated circuit according to claim 1, further including:
   a field-effect transistor having a source, a drain and a channel formed in the active area; and
   an electrical connection between the polycrystalline silicon layer and the source for ensuring an electric potential of the polycrystalline silicon layer approximately equals an electric potential of the source.

3. The integrated circuit according to claim 1, further including:
   a field-effect transistor having a source, a drain and a channel formed in the active area; and a gate insulation layer overlying the channel of the field-effect transistor, the gate insulation layer having a thickness less than a thickness of the insulation layer overlying the isolation region.

4. The integrated circuit according to claim 1, further including:

a voltage supply of a selected electric potential; and an electrical connection between the polycrystalline silicon layer and the voltage supply for ensuring that the polycrystalline silicon layer is held at the selected potential.

5. The integrated circuit according to claim 4 wherein the selected electric potential is ground potential.

6. The integrated circuit according to claim 4 wherein the selected electric potential is a lowest electric potential supplied to the integrated circuit.

7. The integrated circuit according to claim 4 wherein the selected electric potential is the highest electric potential supplied to the integrated circuit.

8. The integrated circuit according to claim 4 wherein the selected electric potential is of a value to ensure that current flow in the isolation region is impeded during operation of the integrated circuit.

9. The integrated circuit according to claim 4 wherein the selected electric potential is an approximately constant value at all times during operation of the integrated circuit.

10. An integrated circuit, comprising:

a semiconductor substrate;

first and second regions of a first conductivity type in the substrate;

a third region of a second conductivity type in the substrate and positioned between the first and second regions:

an insulation layer of a selected thickness overlying the third region;

a polycrystalline silicon layer of the second conductivity type overlying the insulation layer, the polycrystalline silicon layer having a doping concentration approximately two to five times a doping concentration of the third region;

a voltage supply of a selected potential:

an electrical connection between the polycrystalline silicon layer and the voltage supply, the value of the voltage supply being selected to impede current flow between the first and second regions to electrically isolate the first and second regions from each other; and wherein the insulation layer has an opening to the third region, and the polycrystalline silicon layer fills the opening and contacts the third region to provide the electrical connection to the voltage supply through a contact between the polycrystalline silicon layer and the third region.

11. The integrated circuit according to claim 10 wherein the electrical connection to the polycrystalline silicon layer includes metal.

12. The integrated circuit according to claim 10 wherein the selected potential is the lowest potential provided to the integrated circuit.

13. An integrated circuit, comprising:

a semiconductor substrate;

a first active area formed in the substrate and having a first source region, a first drain region, and a first channel region overlaid by a first gate insulator of a first selected thickness;

a second active area formed in the substrate and having a second source region, a second drain region, and a second channel region overlaid by a second gate insulator of the first selected thickness;

an isolation region formed in the substrate and positioned between the first and second active areas;

an insulation layer of a second selected thickness overlying the isolation region and having a plurality of spaced openings, the second selected thickness being greater than the first selected thickness; and a polycrystalline silicon layer overlying the insulation layer and filling each of the openings and contacting the isolation region to maintain the polycrystalline silicon layer and the isolation region directly below it at approximately the same electric potential to impede the flow of current between the first and second active areas, the polycrystalline silicon layer being of a same conductivity type as the isolation region and having a doping concentration approximately two to five times a doping concentration of the isolation region.

14. The integrated circuit according to claim 13 wherein the second selected thickness is more than twice the first selected thickness.

15. The integrated circuit according to claim 13 wherein the second selected thickness is approximately five times the first selected thickness.

16. The integrated circuit according to claim 13, further including a gate electrode overlying the first gate insulator, and wherein the polycrystalline silicon layer overlying the insulation layer is a first polycrystalline silicon layer and the gate electrode includes a second, separate polycrystalline silicon layer.

17. The integrated circuit according to claim 16 wherein the second polycrystalline silicon layer is deposited after the first polycrystalline silicon layer.

18. The integrated circuit according to claim 16 wherein the second polycrystalline silicon layer has a thickness greater than a thickness of the first polycrystalline silicon layer.

* * * * *